United States Patent [19]

Robbins et al.

[11] 4,107,987
[45] Aug. 22, 1978

[54] GEOTHERMAL WELL PUMP PERFORMANCE SENSING SYSTEM AND MONITOR THEREFOR

[75] Inventors: Kenneth W. Robbins, Wilmington; Gerald F. Ross, Lexington, both of Mass.

[73] Assignee: Sperry Rand Corporation, New York, N.Y.

[21] Appl. No.: 810,220

[22] Filed: Jun. 27, 1977

[51] Int. Cl.² .......................................... E21B 47/06
[52] U.S. Cl. ...................................... 73/151; 60/641
[58] Field of Search ...................... 73/151, 1 R, 1 F; 60/641; 323/75 F, 75 B; 324/63

[56] References Cited

U.S. PATENT DOCUMENTS

| | | | |
|---|---|---|---|
| 2,508,446 | 5/1950 | Conant | 323/75 F |
| 3,209,248 | 9/1965 | Siefert | 324/63 |
| 3,988,896 | 11/1976 | Matthews | 60/641 |

*Primary Examiner*—Anthony V. Ciarlante
*Attorney, Agent, or Firm*—Howard P. Terry

[57] ABSTRACT

The operating characteristics of deep well pumping equipment in a geothermal well power-generation system are observed by cooperating sensor and communication elements permanently associated with the geothermal well equipment itself. Bridge circuit sensors detect well water temperature and water pressure below and above the pump, while a further sensor detects pump rotational speed. The data is transmitted by a multiplexing acoustic communication link coupled to receiver and display means located at the earth's surface. An electrical generator driven at the pump speed serves as the rotational speed pick off and additionally supplies multiplexing and signal processor power for use at the down-well site. The signal processor includes novel diode circuits in each bridge sensor channel for monitoring the operation of the individual sensors and their common power source, thereby providing a surface display of the parameter being measured by a particular sensor channel and additionally providing a calibrating display of the operating status of that channel.

19 Claims, 8 Drawing Figures

GEOTHERMAL WELL PUMP PERFORMANCE SENSING SYSTEM AND MONITOR THEREFOR

BACKGROUND OF THE INVENTION

1. Field of the Invention

The invention relates generally to measurement, communication, and performance-monitoring equipment used in the installation and operation of geothermal well power systems of the kind for generating electrical power by utilizing energy from subterranean geothermal sources and, more particularly, relates to improvements in such arrangements for monitoring the operation of down-well geothermal power systems including efficient super-heated working fluid generation and hot brine pumping equipment for deep hot water wells for the beneficial transfer of thermal energy to the earth's surface.

2. Description of the Prior Art

The present invention is designed for use in the operation of geothermal well power generation systems of the general class disclosed in several prior United States patents issued to Sperry Rand Corporation:

H. B. Matthews U.S. Pat. No. 3,824,973 issued Oct. 24, 1972 for a "Geothermal System and Method",
H. B. Matthews U.S. Pat. No. 3,898,020 issued May 8, 1974 for a "Geothermal System and Method",
K. E. Nichols et al. U.S. Pat. No. 3,905,196 issued Sept. 16, 1975 for a "Geothermal Energy Pump Thrust Balance Apparatus",
J. L. Lobach U.S. Pat. No. 3,908,380 issued Sept. 30, 1975 for a "Geothermal Energy Turbine and Well System", and
H. B. Matthews et al. U.S. Pat. No. 3,910,050 issued Oct. 7, 1975 for a "Geothermal Energy System and Control Apparatus".

The patents disclose geothermal energy recovery systems making use of energy stored by subterranean heat sources in solute-bearing water to generate a super-heated working fluid from a surface-injected flow of clean liquid; the super-heated working fluid then operates a turbine-driven pump within the well for pumping the hot brine at high pressure and always in liquid state to the earth's surface, where it transfers its heat in a binary closed-loop heat exchanger, vapor turbine, alternator combination for generation of electrical power. Residual brine is pumped back into the earth, while clean, cooled fluid is regenerated at the surface-located system and is returned to the deep well pumping system for generating the super-heated fluid.

The invention may readily be employed also in an alternative geothermal energy recovery system disclosed in the H. B. Matthews U.S. patent application Ser. No. 674,243 filed Apr. 6, 1976 for a "Geothermal Energy Conversion System", that makes use of thermal energy in solute-bearing well water during the period that it is pumped upward to the earth's surface through an extended heat exchanger for continuously heating a downward-flowing working fluid. The added energy of the latter fluid is then used within the well for operating a turbine-driven pump for pumping the hot well water at high pressure and always in liquid state to the earth's surface, where it is reinjected into the earth by a sump well. The temperature difference between the upward flowing brine and the downward-flowing working fluid is maintained in a predetermined manner along the length of the subterranean extended heat exchange element. After driving the deep well turbine-driven pump, the working fluid in supercritical state arises to the earth's surface in a thermally insulated conduit; at the earth's surface, electrical power generation equipment is driven by the ascending working fluid, after which it is returned into the well for reheating as it travels downward in the extended heat exchanger.

Such geothermal wells may be logged with a minor degree of success by methods previously applied in the oil well industry. In such tests, a canister which may contain sensors, a battery, and a recorder is lowered into the well and is then brought back to the earth's surface where the recorded data is retrieved. Such a time-consuming method is undesirable even in the oil well application, as it is not a real time method and requires removal of pumping equipment from the well. When a geothermal well pumping system is present in the well, its removal unless disabled cannot be considered on economic grounds and therefore only secondary ways of finding out what is occurring at the deep well pump site are actually available in the prior art. For example, the control system of the aforementioned Matthews et al. U.S. Pat. No. 3,910,050 provides the additional opportunity of display at the surface of certain secondary data about the over-all operation of the system, but direct measurements of primary parameters that instantaneously reflect information about the efficiency of operation of the deep well geothermal pump system are not provided. These latter are the primary parameters that are of major interest during installation, adjustment, and continued operation of geothermal systems.

In the H. B. Matthews U.S. Pat. No. 3,988,896, issued Nov. 2, 1976 for a "Geothermal Energy Pump and Monitor System", there is described a permanent and direct monitoring system, with respect to which the present invention is an improvement, desirably providing continuous monitoring of primary parameters by sensors located at the deep well pump itself. Permanently active sensors are employed for detecting fluid pressure and temperature changes too small and too slowly varying to be detected accurately by secondary means, but nevertheless significant with respect to the life and efficiency of the pump installation.

In U.S. Pat. No. 3,988,896, it is indicated that the parameters of primary interest include water pressure and temperature immediately below the pump, the pressure increment across the pump, and the rotational speed of the pump, each in the form of an electrical signal, these signals being communicated to a receiver and utilization means at the earth's surface. A pump-driven electrical generator supplies an alternating electrical signal whose frequency is representative of pump rotation speed, also supplying electrical energy required for multiplexing and for communication to the surface of the multiplexed signals.

SUMMARY OF THE INVENTION

The present invention provides means for the direct, continuous and instantaneous monitoring of the operation of deep well geothermal energy extraction systems of the kind described in the aforementioned patents and in addition for the simultaneous and continuous evaluation of the status of the monitoring equipment while it is itself active. Cooperating bridge temperature and pressure sensors and communication elements permanently associated with the geothermal pump detect well water temperature and pressure, for example, while a pump-driven electrical generator provides a pump rotation rate signal also used as power to activate signal processing and communication equipment for transmitting the measured data to the earth's surface for display or control purposes. The signal processor cooperates with novel diode circuits in each bridge sensor channel for analyzing the operation of the individual bridge circuit sensors and their power source. Thus, there is provided a surface display of the several measured operating parameters along with a display of the operating status of the several respective sensor channels.

DESCRIPTION OF THE PREFERRED EMBODIMENTS

Figure 1:
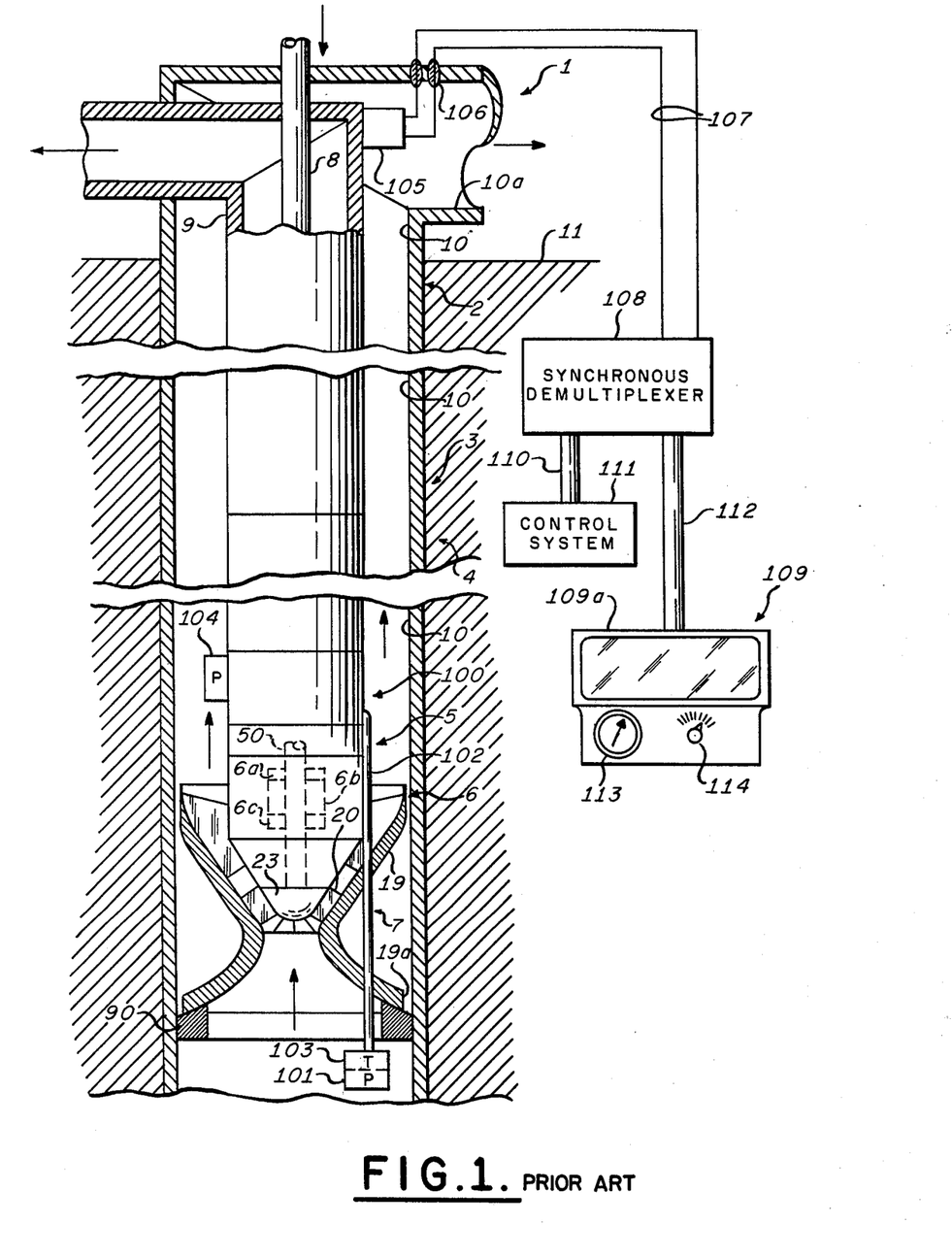
FIG. 1 is an elevation view partly in cross section of a representative geothermal well installation in which the invention may be employed.

FIG. 1 illustrates a representative geothermal energy extraction system immersed in a deep well extending into heated strata located far below the surface 11 of the earth, preferably being located at a subterranean depth such that a copius supply of extremely hot geothermal water under high pressure is naturally available, the active pumping system being coupled to the water source within a generally conventional well casing pipe 10. The configuration includes a well head section 1 normally extending above the earth's surface 11 and a main well section 2 extending down from well head section 1. Near the subterranean source of hot, high pressure water, which is normally a brine, the main well section 2 joins a working fluid generator input section 3. The working fluid generator section 4, the turbine section 5, the rotary bearing section 6, and the hot well water pumping section 7 follow in close cooperative succession at increasing depths. Interposed between the working fluid generator section 4 and the turbine section 5 is an instrumentation section 100 including voltage generation, measurement, signal processing, and communication elements of the invention. Section 100 remains to be described in greater detail with respect to FIGS. 2, 3, 5 and 6.

Extending downward from the well head section 1, the well casing 10 surrounds in generally concentric relation an inner pipe 8 for supplying from the earth's surface 11 a relatively cool and pure fluid at the bottom of the well. A second and relatively large pipe 9 surrounding pipe 8 extends from the well head 1 to the energy conversion and pumping system within the well and permits working fluid exhausted from the turbine to flow upward to the earth's surface 11.

Figure 2:
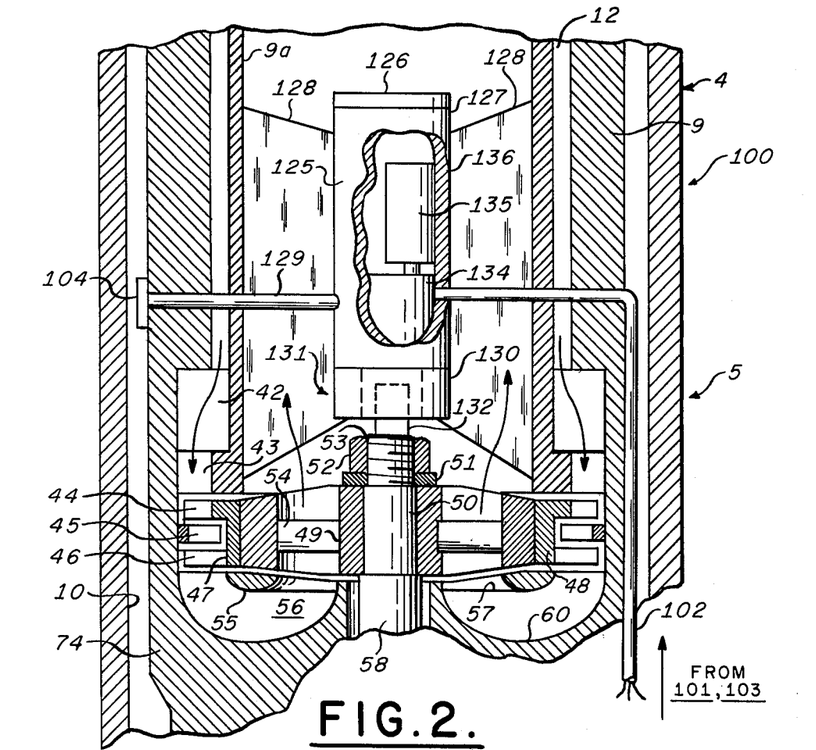
FIG. 2 is a detailed elevation view in cross section showing the location of certain parts of the apparatus of the present invention, the view corresponding to part of the drawing of FIG. 1.

It will be understood from FIGS. 1 and 2 that a clean, cold recirculating fluid is pumped down inner pipe 8 to the input of the working fluid generator sections 3 and 4 thence to be delivered to the working fluid turbine section 5. The function of the turbine motor located in section 5 and supported by shaft 50 and bearings 6a, 6b and 6c located in the rotary bearing section 6 is to drive the hot well water pump located in section 7. Hot, high pressure well water is thus impelled past seal 90 and between the rotating conical end 23 of the pump and the associated shroud 19a, 19. The hot brine well water is pumped upward at high velocity in the conduit between pipes 9 and 10, thus permitting use of the thermal energy it contains at the earth's surface 11. More important, the hot well water is pumped up to the earth's surface 11 at a pressure preventing it from flashing into steam and thus undesirably depositing dissolved salts at any point of flashing.

Accordingly, it is seen that the extremely hot, high pressure geothermal well water is pumped upward, flowing in the conduit defined by pipes 9 and 10. Heat supplied by the hot well water readily converts the cool, clean fluid flowing into working fluid generator section 4 into an extremely energetic working fluid which may be a vapor or other super-heated fluid. The cool, clean fluid may be supplied at a high pressure so that it does not undesirably flash into steam. The highly energetic working fluid arrives at the turbine motor section 5 where it drives the turbine and shaft 50 and is redirected to flow upward in closed-loop fashion to the earth's surface 11 after energy release as a relatively cooled fluid flowing in the conduit defined by pipes 8, 9. Thermal energy may be recovered at the earth's surface from the hot well water or, alternatively, it may be extracted primarily from the working fluid in super-critical state as taught in the aforementioned Matthews patent application Ser. No. 674,243.

According to the invention, the hot well water pump input pressure is measured by a conventional electrical pressure sensor 101 of the bridge type located, for example, below the pump input shroud 9a. The electrical output signal from sensor 101 is conveyed by conductors within corrosion-immune tube 102 into the instrumentation section 100. Tube 102 or other conventional support elements are sufficient to support pressure sensor 101 as well as a closely associated conventional temperature sensor 103 again of the conventional bridge type, from which further electrical signals are coupled into instrumentation section 100. An additional conventional pressure sensor 104 mounted within the conduit between pipes 9, 10, as on the outer surface of instrumentation section 100, is used to provide electrical signals within instrumentation section 100 representing the magnitude of the pressure of the pumped well water as it flows between pipes 9, 10 above pump section 7. Further electrical signals representative of the rate of rotation of pump shaft 50 and therefore of the turbine and the geothermal pump itself are generated by an alternating current generator coupled to shaft 50 as will be described particularly in connection with FIGS. 2 and 3.

The temperature, pressure and speed representative signals are processed within instrumentation section 100, wherein multiplexed signals are generated for propagation toward the earth's surface 11. Acoustic or electric signals may thus be received at the earth's surface 11 for use in apparatus for display, recording or control purposes.

The present invention in its preferred form avoids the use of electrical signal conductors between the geothermal pump and cooperating equipment at the earth's surface 11, preferably employing wave communication within one of the pipes extending from the pump to the earth's surface, including the well casing, or within the volume confined between two such pipes. The acoustic communication system of FIG. 1 is similar to that of the aforementioned Matthews U.S. Pat. No. 3,988,896 wherein the data is transmitted by launching coded acoustic waves in pipe 9 at the instrumentation section 100, which waves travel upward to the well head section 1 where they are received by a conventional sonic receiver 105, there to be converted in the usual manner into coded, electrical signals. The latter are coupled, for example, by electrical conductors through seal 106 to demultiplexer 108. Device 108 may be a conventional kind of demultiplexer operated synchronously with respect to the operation of a multiplexer within instrumentation section 100 by virtue of the periodic transmission of a synchronizing signal by the latter and its automatic use by demultiplexer 108. The newly separated signals are coupled from demultiplexer 108 via cable 112 for presentation by a suitable conventional display, which may be a pen or other recorder, an array of individual electrical meters, or a cathode ray display 109a. It will further be understood that a selected one or more of the demultiplexed signals may be connected for control purposes via cable 110 to a control system 111 for use in operating a system, for example, such as that of the general kind disclosed in the aforementioned U.S. Pat. No. 3,824,793.

General features of the instrumentation 100 will be understood by reference to FIG. 2 in that it illustrates in more detail a portion of the working fluid generator section 4 and of the turbine section 5 associated therewith. The several conduits of section 3 extend into the working fluid generation section 4 and then through the instrumentation section 100. The hot pumped well water passage is located between pipes 9 and 10, while the heated working fluid passes downward through the annular passage 12. The passage for upward flow of the working fluid exhausted by the turbine motor is within wall 9a of pipe 9.

For operating the turbine motor of FIG. 2, the energetic working fluid flows through passageway 12 into manifold 42, from whence it is distributed into an array of injection nozzles 43 of generally conventional design. Nozzles 43 are employed in the conventional manner to direct the high velocity working fluid against the blades 44, 46 of the turbine stages. The blade arrays 44, 46 cooperate in the usual manner with an intermediately disposed array 45 of blades affixed to the body block 74 common to turbine section 5 and bearing section 6. The ring 47 bearing the blade arrays 44, 46 is affixed to rim 48 which is, in turn, part of a wheel additionally provided with a set of spokes 54 and a hub 49. Hub 49, when the rotor assembly is rotating, causes shaft portions 50, 58 also to rotate, hub 49 being secured to shaft portion 50 by a washer 51 and nut 52 disposed on the threaded extension 53 of shaft portion 50.

Still referring to FIG. 2, the spent working fluid, having yielded energy to the turbine rotor, is redirected to flow upward to the earth's surface 11. For this purpose, turbine body block 74 contains an annular smoothly-curved toroidal passage 56 which redirects the exhaust working fluid issuing from the blade assembly 46 to flow radially inward toward shaft portion 58, at the same time altering its direction so that the exhaust fluid is caused to flow upwardly between the several spokes 54 of the turbine rotor. Passageway 56 is defined in part by the toroidal surface 60 within body block 74 and by the surface of the opposed annular guide ring 55, which ring is supported by an array of radially extending vanes 57. Vanes 57, in addition to supporting ring 55, also serve to aid in redirecting exhaust fluid so that it flows primarily vertically past spokes 54, reducing any rotational components of its motion.

The instrumentation system of the present invention includes the axially disposed container 125 supported by radial vanes 128 from surface 9a and with a lid 126 hermetically sealed at seal 127 at a convenient internal pressure of hydrogen, for example. The aforementioned protective tube 102 from sensors 101 and 103 passes through pipe 9 into container 125; likewise, a similar protective tube 129 shields electrical conductors from sensor 104 so that they may be passed into container 125.

The base of the instrumentation container 125 directly supports the wound stator 130 of a conventional alternating current generator 131. The rotor may be disposed on an extension 132 of turbine shaft 50; while not limited to such an arrangement, the conventional rotor is illustrated as including a permanent magnet 133. Generator 131 resides in the relatively cool atmosphere of the turbine exhaust and its rotor 132 is normally driven by the turbine motor at a high rate of the order of 20,000 revolutions per minute. It is readily apparent that the output of motor 131 is a signal of useful voltage and power level for the purposes of the invention, and that the output has a frequency that is a direct function of turbine and pump speed.

The instrumentation container 125 protects the circuits 134 it contains from the exhausted working fluid flowing past it. The multiplexed output of circuits 134 is a conventional coded representation, for example, of the data to be transmitted to the earth's surface 11 and is applied to a conventional sonic transducer 135. The consequent coded sound impulses are coupled directly to wall 136 of container 125, through radial vane 128 into pipe 9 and then, as in FIG. 1, up through pipe 9 to the sonic receiver 105.

Figure 3:
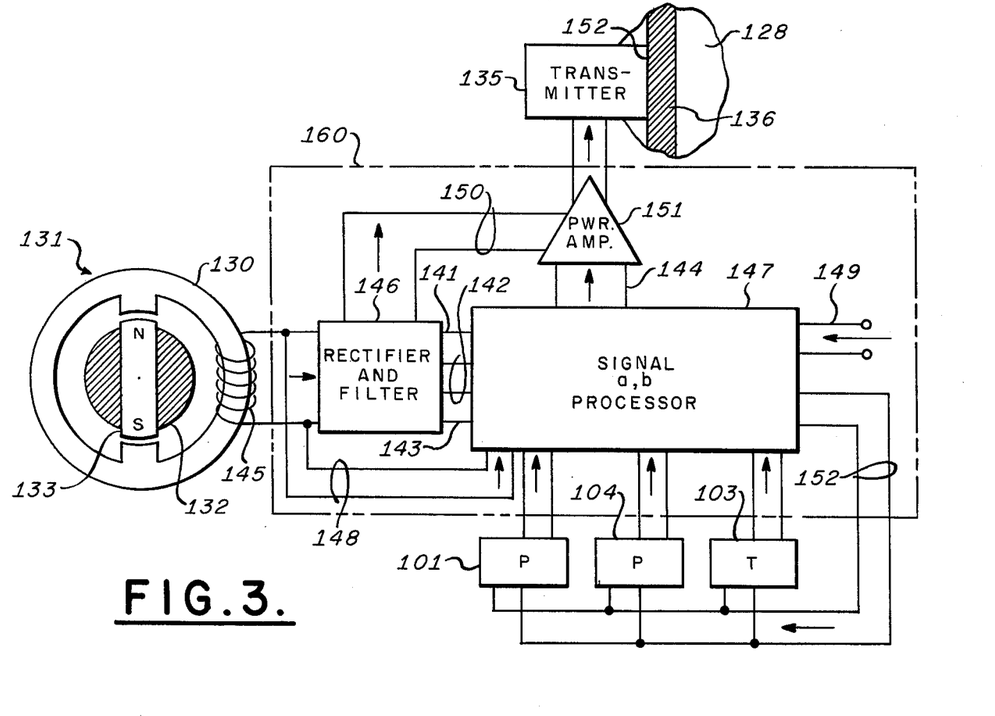
FIG. 3 is a wiring diagram showing electrical features of the apparatus of FIG. 2 and illustrating component circuit elements and their interconnections.
Figures 6, 8:
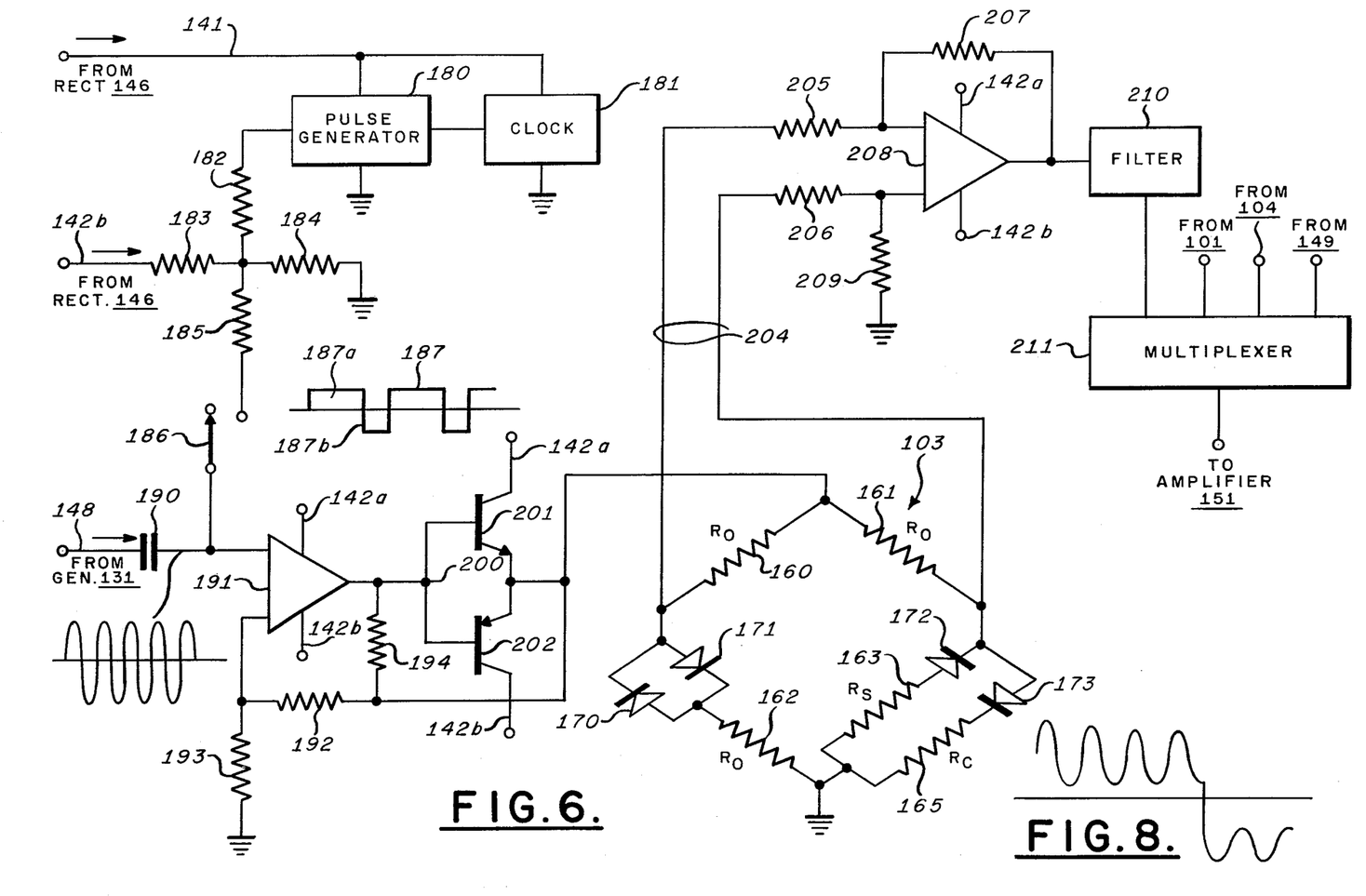
FIG. 6 is a detailed wiring diagram showing two ways in which the sensor circuit of FIG. 5 may be used according to the invention.
FIG. 8 is a graph useful in explaining the operation of one form of the invention.

In one form of the invention, the arrangement of FIG. 3 is employed for processing the sensor signals and for transmitting them to the earth's surface 11; this figure illustrates schematically the alternator 131 with its rotor 132 and stator 130. The alternating output of stator winding 145 is applied as one input via leads 148 to signal processor 147. In a similar manner, the outputs of bridge sensors 101, 103 and 104 are applied to other corresponding pairs of inputs of signal processor 147; additional sensors may be coupled to still other inputs of processor 147, as at terminals 149. Each sensor 101, 103, 104 is excited via leads 152 with a modified version of the signal on input leads 148 formed within signal processor 147.

After synchronous multiplexing by a component part of the signal processor 147 yet to be discussed with respect to FIG. 6, the coded representations of each of the sensor signals may be applied to a power amplifier 151 before application to sonic transmitter transducer 135 for launching acoustic signals such as compression, shear, or other sonic waves for propagation in wall 136 which then propagate into vane 128 and up pipe 9 to sonic receiver transducer 105 of FIG. 1, as previously discussed.

In addition to supplying the rotational speed signal for the processor input leads 148 and to exciting sensors 101, 103, 104, generator 130 is conveniently used as an electrical power source for operating active circuits of which the signal processor 147 is composed. For this purpose, the alternating voltage across winding 145 is rectified and filtered in rectifier 146 and is coupled after rectification into signal processor 147 via leads 141, 142, 143 and is also sent via leads 150 to power the amplifier 151.

The nature of the bridge sensor circuits 101, 103, 104 will now be discussed with respect to FIGS. 4 and 5, including features of the invention permitting automatic calibration of the sensors. From the foregoing, it will be seen that the novel bridge sensors are to be used in a hostile environment where they are subjected to extremely high temperatures and to serious levels of mechanical vibration and wherein the short lives of ordinary mechanical or electronic switches cannot be tolerated. For example, one might consider using the ordinary bridge circuit of FIG. 4 in the present application. Such a bridge would consist of four resistance arms 160, 161, 162, 163, across opposed input terminals of which an alternating voltage source such as generator 131 would be coupled. The standard resistors 160, 161, 162 would normally have equal and stable resistance values $R_o$, while resistor 163 would be a temperature, pressure, or strain sensing resistor of variable resistance $R_s$, again of conventional nature. The second or output pair of bridge terminals are conventionally fed to a differential amplifier 166 for common mode rejection. For calibration purposes, a switch 164 is supplied in series with the sensor resistor 163 so that a calibration resistor 165 of fixed and stable resistance $R_c$ may be inserted in place of the variable sensor resistor 163.

Thus, to check the bridge balancing resistors 160, 161, 162, switch 164 is moved from resistor 163 to resistor 165; the source voltage E may be similarly checked. When the test is made, any off-set voltage detected is present because one or more of the balancing resistors 160, 161, 162 have correspondingly changed their resistances. Where expensive stable balancing resistors 160, 161, 162 are trusted to retain their original resistance values for a reasonable time period, the presence of an off-set voltage indicates a change in the source voltage E. However, this arrangement is unreliable, because the switch 164 on which the success of the measurement highly depends is particularly unreliable in the severe environment of the down-well geothermal pump. In fact, switch 164 becomes the least reliable element of the sensor. Its use cannot be tolerated, since it is not economical to pull the pump system from the deep well on the basis of a false indication of its operating condition. Further, the primary problem of controlling switch 164 from the earth's surface without electrical conductors passing down through the well is still present.

Figure 4:
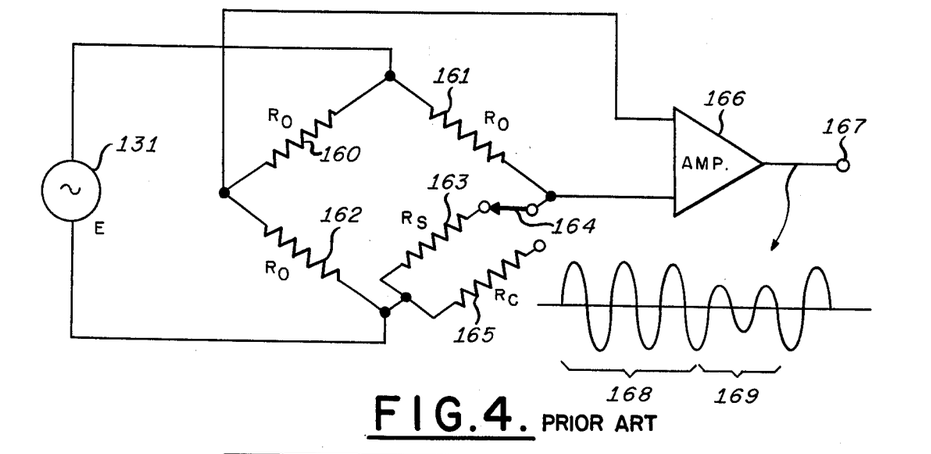
FIG. 4 is an electrical circuit of a bridge sensor useful in explaining the advantages of the invention.
Figure 5:
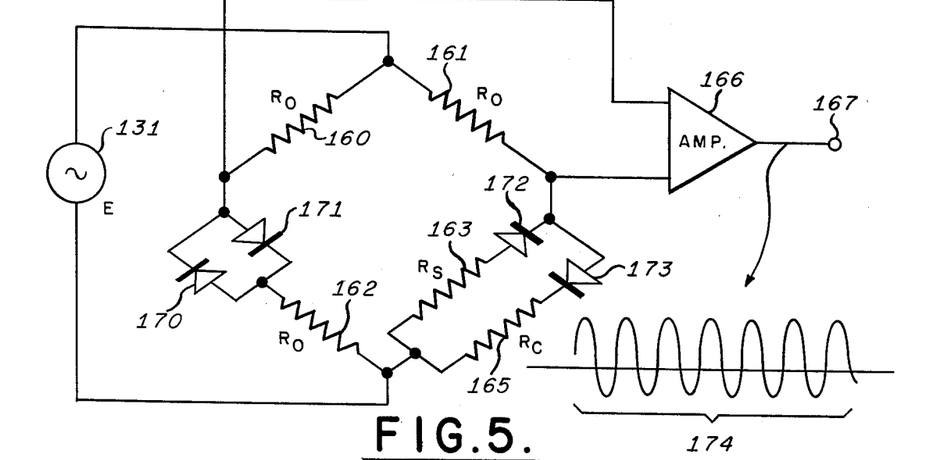
FIG. 5 is an electrical bridge circuit and sensor according to the invention.

Two forms of the novel bridge sensor system may be generally discussed from FIG. 5; here, the bridge includes stable balancing resistors 160, 161, 162, as before, a resistor 163 sensitive to temperature or to another parameter to be measured, and a fixed calibrating resistor 165. An alternating potential E is applied across input terminals of the bridge from alternator 131, while any unbalance signal is fed to a differential amplifier 166 yielding a corresponding output at terminal 167. The switch 164 of FIG. 4 is no longer used; instead, the sensor resistor 163 is coupled permanently in series with diode 172 and the calibrating resistor 165 is coupled permanently in series with diode 173. The diodes are oppositely poled as shown in FIG. 5 and the diode-resistor combinations are in permanent parallel relation. In addition, the arm of the bridge containing the fixed resistor 162 contains in parallel disposition the oppositely poled diodes 170, 171, the parallel circuit being in permanent series relation with resistor 162. The deleterious effects of switch 164 in the alternating current bridge are eliminated by the foregoing substitution.

It will be understood that the value $R_c$ of the stable calibration resistor 165 will, in practice, be somewhat greater than the value $R_o$ characteristic of resistors 160, 161, 162, or $R_c = R_o + \Delta$ where $\Delta$ is the value of the corresponding small resistance increments. Further, the value of E is easily selected to be large compared to the individual work potentials of diodes 170, 171, 172, 173 so that the latter may be neglected. Accordingly, on the positive half cycles of the output of generator 131, which may be a symmetric square wave or sine wave, the bridge arms have the resistance values:

$$R_o, R_o, R_o + R_{171}, \text{ and } R_o + \Delta + R_{173}.$$

On the negative half cycles of that wave, the arms have the resistance values:

$$R_o, R_o, R_o + R_{170}, R_s + R_{172}.$$

The bridge is readily designed so that $R_o$ is large compared to the diode forward resistances and $R_{170}$, $R_{171}$, $R_{172}$ and $R_{173}$ may be neglected. Hence, on one half of the cycle, it is essentially $R_s$ that is sensed, while on the opposite half it is $R_o + \Delta$ or $R_c$ that is sensed. Diodes 170, 171, 172, 173 do not inject temperature compensation problems; they are mounted on the same semiconductor substrate. Secondly, diodes 170, 171 are in parallel and automatically provide compensation because their forward resistances are selected to change with temperature in precisely the same manner as the changes in diodes 172, 173.

It will be seen from FIG. 4 that it is readily arranged that the output at terminal 167 have a distinguishing character whereby the part 168 of the output wave is recognized as generated when sensor resistor 163 is in circuit and that the part 169 of the output wave is generated when the calibration resistor 165 is in circuit. This is arranged by having resistor 163 in circuit significantly longer than resistor 165. In FIG. 4, intervals of three and two cycles are shown, but many other ratios may be used, such as 50 and 20. Thus, the signal displayed by indicator 109 of FIG. 1 is readily interpreted by visual inspection. It will also be understood that the rotation rate frequency is continuously present in the wave 168, 169, so that a standard frequency detection circuit may use the whole duration of the wave for displaying pump rotation frequency on meter 113 in FIG. 1. While the circuit of FIG. 5 avoids the use of the undesirable switch 164, its use involves the complexity of the transmission of a direct current component as well as an alternating component to the display 109. In FIG. 5, the positive half cycles of wave 174 represent current flowing through the sensor resistor 163 and the negative half cycles that flow through the calibrating resistor 165.

While wave 174 may be coupled directly to an oscilloscope and used successfully in many applications, it is not entirely convenient for use in the deep well situation. For the latter and similar purposes, a more convenient method of performing the bridge calibration is to add a large unidirectional voltage to the alternating voltage E from generator 131. The added voltage will be cyclically positive and negative, the positive part of the wave being longer than the negative, for example. Now, if a high pass filter is used at the output of amplifier 166, the undesired d.c. output component is eliminated, and the output wave has the appearance of wave portions 168, 169 of FIG. 7; it therefore is similar to that of FIG. 4 and may be used directly by display 109.

The arrangements discussed in connection with FIG. 5 are shown in more detail in FIG. 6, where corresponding reference numerals are again employed. In FIG. 6, the variable frequency output wave 180 of generator 131 is coupled by capacitor 190 to one input of a differential amplifier 191 whose output is coupled back through resistors 194, 192 to the second input of amplifier 191. This second input is also coupled to ground through resistor 193. Amplifier 191 will ordinarily be supplied in the usual manner via leads 142a, 142b with respective positive and negative operating voltages generated in rectifier 146 of FIG. 3 (nominally ± 15 volts). Transistor amplifiers 201, 202 are arranged in series connection as shown in FIG. 6, being connected to the same voltages from leads 142a, 142b. The output of amplifier 191 is coupled at terminal 200 in parallel to their bases, while an output lead coupled between their emitters is applied across the sensor bridge as it was in FIG. 5, but with one side of the bridge being grounded as a matter of convenience.

The bridge output on leads 204 is coupled through unequal resistors 205, 206 to the inputs of differential amplifier 208. The output of amplifier 208 is coupled back through resistor 207 to a first input of amplifier 208, while its second input is coupled to ground through resistor 209. Working potentials are again supplied via leads 142a, 142b. When the output of differential amplifier 208 is supplied, not through filter 210, but directly to the input of an oscilloscope or other display, the wave 174 of FIG. 8 is produced and may readily be interpreted as previously explained in connection with FIG. 5.

Figure 7:
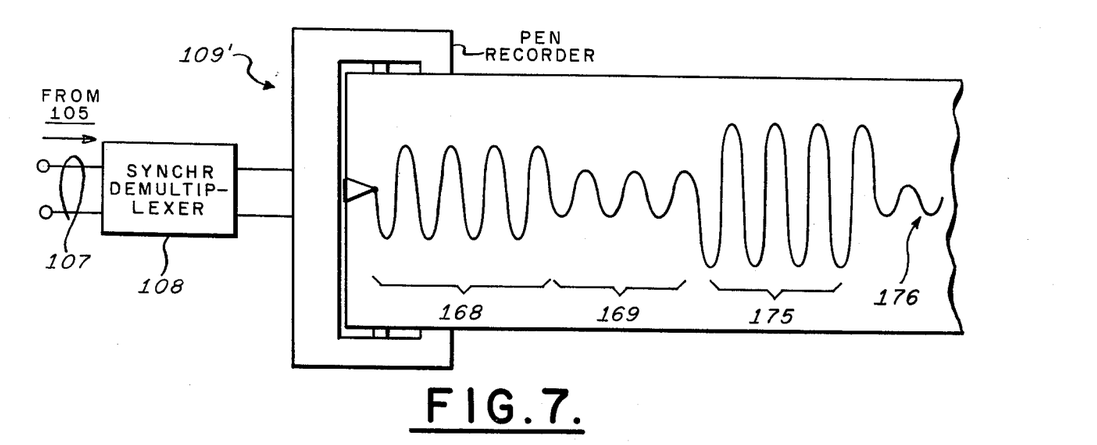
FIG. 7 illustrates a display alternative to that shown in FIG. 1.

To produce the display of FIG. 7, filter 210 is interposed between amplifier 208 and multiplexer 211. A further arrangement is added to the circuit of FIG. 6 to permit identification of the sensing and calibrating signals as in FIG. 7. A clock 181 activated by power on lead 141 from rectifier 146 times a conventional counter-pulse generator 180 to produce the asymmetrically timed wave 187 with the assistance of network 182, 183, 184, 185, having positive and negative portions 187a, 187b of different durations (nominally ± 2 volts). Each successive portion of wave 187 may hold many but different numbers of cycles of wave 188. The output of pulse generator 180 passes through series resistors 182, 185 and switch 186, when closed, to the first input of amplifier 191 to which wave 188 is also coupled. The junction between resistors 182, 185 is also a junction intermediate resistors 183, 184, resistor 183 being supplied with a negative working potential via lead 142b and the opposite end of resistor 184 being grounded.

During the positive part 187a of wave 187, it is applied to the first input of differential amplifier 191 and the output of the latter swings positive until the inverting input via transistor 202 reaches the same level (nominally +2 volts). The consequent level (+4.6 volts) at the emitter of transistor 201 causes diodes 171 and 173 to conduct fully, while diodes 170, 172 and transistor 202 are back-biased. Flow of the current 188 is thus through the calibrating resistor 165 and wave 168 is displayed (FIG. 7). During the negative part 187b of wave 187, it is applied to the first input of differential amplifier 191 and the output of the latter swings negative until the inverting input via transistor 202 is also negative (nominally −2 volts). The consequent level (−4.6 volts) at the emitter of transistor 202 causes diodes 170 and 172 to conduct fully, diodes 171 and 173 and transistor 201 being back-biased. Flow of current 188 is thus through the sensing resistor 163 and wave 169 is displayed (FIG. 7). So that there is a finite output at a selected arbitrary zero for the temperature (or pressure) scale, proving that the system is operational even at the selected zero reference, an unbalance in the input of differential amplifier 208 is established by having resistor 205 about a third larger than resistor 206, for example.

As seen in FIG. 8, a change in the d.c. level occurs in the resultant output of amplifier 208 (FIG. 7), but this undesired d.c. component is eliminated by filter 210 so that no d.c. passes to the conventional multiplexer 211. The outputs of similar bridge sensors, such as sensors 101, 104, 149 of FIG. 3, may be applied to other inputs of multiplexer 211 for processing before driving amplifier 151. At the earth's surface 11, the signals may be used to generate the display of FIG. 7 in the form of waves portions 168, 169, which, for example, represent sensor and calibrating outputs of the bridge temperature sensor 103. The immediately succeeding wave portions 175, 176 may, for example, represent sensor and calibrating outputs of bridge pressure sensor 104, et cetera. The display may readily be furnished on a cathode ray oscilloscope 109 (FIG. 1) having the usual sweep synchronizing adjustment 114 or by the conventional ink-pen recorder 109 represented in FIG. 7, for example.

Accordingly, the invention provides means compatible with the severe conditions found in deep-well geothermal wells for the direct, continuous, and instantaneous monitoring of the operation of geothermal water pumping equipment and in addition for the simultaneous and continuous evaluation of the status of the monitoring equipment itself. Without employing electrical conductors between the earth's surface and the deep well pump, a surface-located display of the several measured operating parameters of the pumping system is made, along with a display of the operating status of the several parameter sensing channels themselves.

While the invention has been described in its preferred embodiments, it is to be understood that the words which have been used are words of description rather than of limitation and that changes within the purview of the appended claims may be made without departure from the true scope and spirit of the invention in its broader aspects.

What is claimed is:

1. In apparatus including moving means at a location within a borehole remote from the earth's surface for performing useful work with respect to a medium at said location:

first transducer means having first and second relatively movable parts at least one of said parts being mechanically coupled to said moving means for generating a first electrical signal characteristic of motion of said moving means, multiple-arm bridge means having input means excited by said first electrical signal and first and second discrete output means, said multiple-arm bridge means having one arm including first and second circuits in parallel, said first circuit including first resistor means responsive to a characteristic of said medium and first diode means, said second circuit including second resistor means stable with respect to said characteristic and second diode means poled oppositely with respect to said first diode means, transmitter means utilizing said first electrical signal as enabling electrical operating power and responsive to said discrete output means for transmitting signals representative of said characteristic, and receiver means responsive to said transmitter means and adapted for exciting utilization means exterior of said borehole.

2. Apparatus as described in claim 1 wherein said multiple-arm bridge means includes a second arm having in series relation:

third resistor means stable with respect to said characteristic, and third and fourth diode means coupled in oppositely-poled parallel relation and in series with said third resistor means.

3. Apparatus as described in claim 2 wherein said first, second and third resistor means have a common junction.

4. Apparatus as described in claim 3 wherein said first electrical signal is coupled across said one and said second arm at ends thereof remote from said common junction.

5. Apparatus as described in claim 4 further including fourth and fifth resistor means each stable with respect to said characteristic for forming respective third and fourth arms of said multiple-arm bridge means.

6. Apparatus as described in claim 5 further including:

pulse generator means for generating a bipolar pulse train having positive and negative excursions of unequal time duration, coupling means for additionally exciting said multiple-arm bridge means input means.

7. Apparatus as described in claim 6 wherein the time duration of the shortest of said excursions is long compared to one cycle of said first electrical signal.

8. Apparatus as described in claim 7 additionally including:

rectifier means responsive to said first electrical signal, said pulse generator means being excited by said rectifier means.

9. Apparatus as described in claim 7 further including differential amplifier means having:

first amplifier input means responsive to said first electrical signal and to said pulse train, and second amplifier input means responsive to the output of said differential amplifier means.

10. Apparatus as described in claim 7 further including:

output amplifier means having first and second input means, said first input means including sixth resistor means, and said second input means including seventh resistor means having a resistance smaller than the resistance of said sixth resistor means.

11. Apparatus as described in claim 10 wherein the output of said output amplifier means is coupled to the first input of said output amplifier means.

12. Apparatus as described in claim 11 further including filter means for blocking the passage of direct current flow from said output amplifier means into said transmitter means.

13. Apparatus as described in claim 12 wherein said transmitter means excites waves propagating in a predetermined path with respect to conduit means within said borehole for receipt by said receiver means.

14. Apparatus as described in claim 13 wherein said predetermined path comprises a sonic wave medium, said transmitter and said receiver means respectively including sonic transmitter and receiver means.

15. Apparatus as described in claim 13 additionally including a plurality of multiple-arm bridge means each having input means excited by said first electrical signal and each having associated output means for providing respective measures of a plurality of different characteristics of said medium.

16. Apparatus as described in claim 15 wherein said transmitter means includes multiplexer means for multiplexing signals representative of said characteristic and of said plurality of different characteristics before transmission thereof.

17. Apparatus as described in claim 16 wherein said receiver means includes demultiplexer means for separating said signals representative of said characteristic and each of said plurality of different characteristics.

18. Apparatus as described in claim 12 wherein said second transducer means comprises temperature sensor means.

19. Apparatus as described in claim 12 wherein said second transducer means comprises pressure sensor means.

* * * * *